(12) United States Patent
Sakata

(10) Patent No.: US 7,523,427 B2
(45) Date of Patent: Apr. 21, 2009

(54) TIMING ANALYZER APPARATUS AND TIMING ANALYSIS PROGRAM RECORDING MEDIUM

(75) Inventor: Tsuyoshi Sakata, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 328 days.

(21) Appl. No.: 11/363,206

(22) Filed: Feb. 28, 2006

(65) Prior Publication Data

US 2007/0124710 A1    May 31, 2007

(30) Foreign Application Priority Data

Nov. 29, 2005    (JP)    ............... 2005-343640

(51) Int. Cl.
*G06F 17/50* (2006.01)

(52) U.S. Cl. .............................. 716/6; 716/5

(58) Field of Classification Search .................. 716/4–6
See application file for complete search history.

(56) References Cited

U.S. PATENT DOCUMENTS

| 6,526,541 B2* | 2/2003 | Sugibayashi .................. 716/1 |
| 2006/0059446 A1* | 3/2006 | Chen et al. ..................... 716/6 |
| 2006/0101361 A1* | 5/2006 | Foreman et al. ................. 716/6 |

FOREIGN PATENT DOCUMENTS

JP    2003-316849    11/2003

* cited by examiner

*Primary Examiner*—Vuthe Siek
(74) *Attorney, Agent, or Firm*—Fujitsu Patent Center

(57) ABSTRACT

By multiplying a square root of a sum of squares of a standard deviation of cells constituting a target circuit by a weight, or by calculating a square root of a sum of squares of a weighted standard deviation of the cells, the standard deviation of delay of the target circuit can be obtained. Using the obtained standard deviation of delay of the target circuit and the delay of the target circuit, timing verification is performed.

13 Claims, 19 Drawing Sheets

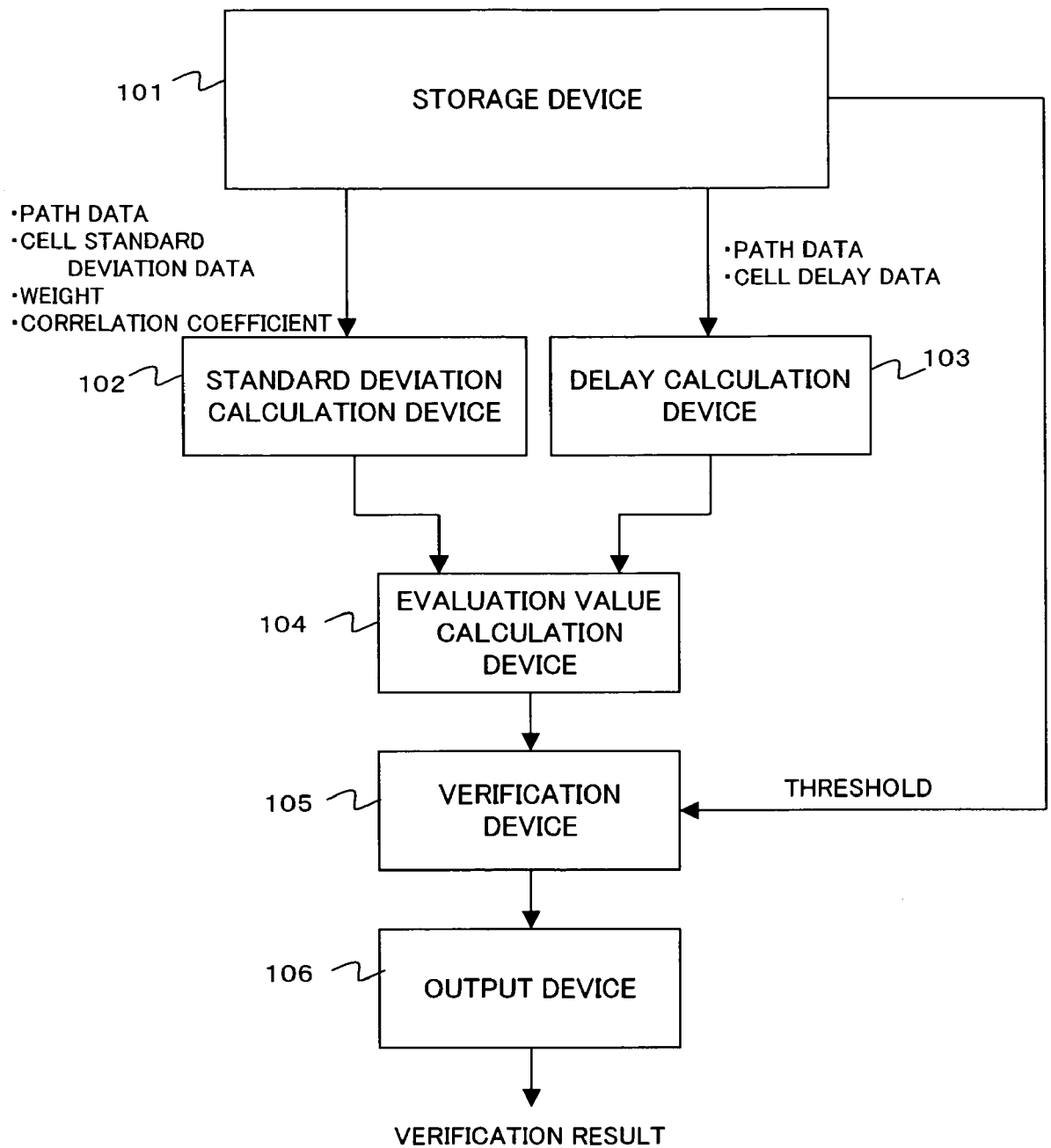
F I G. 2

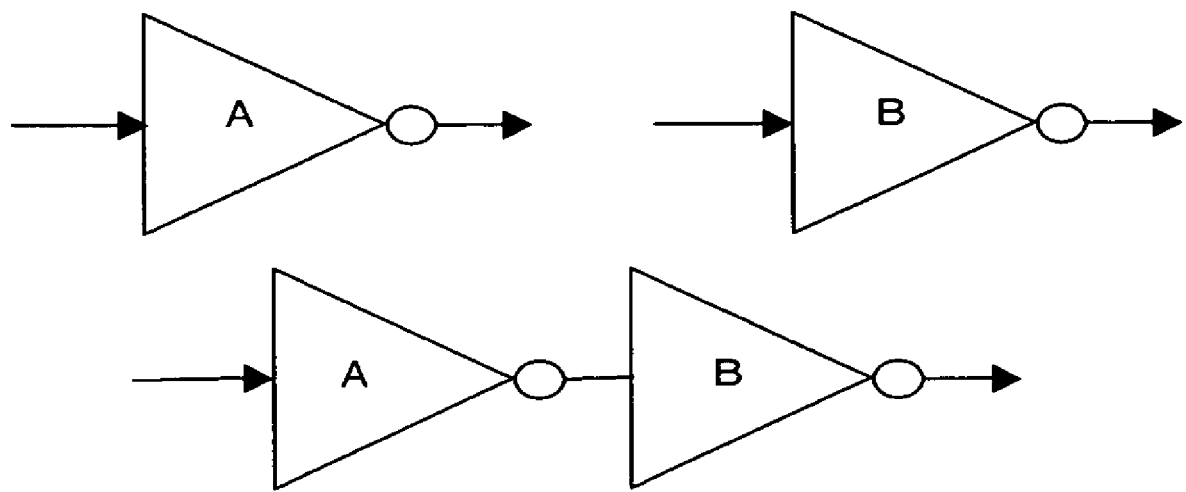
F I G. 3 A

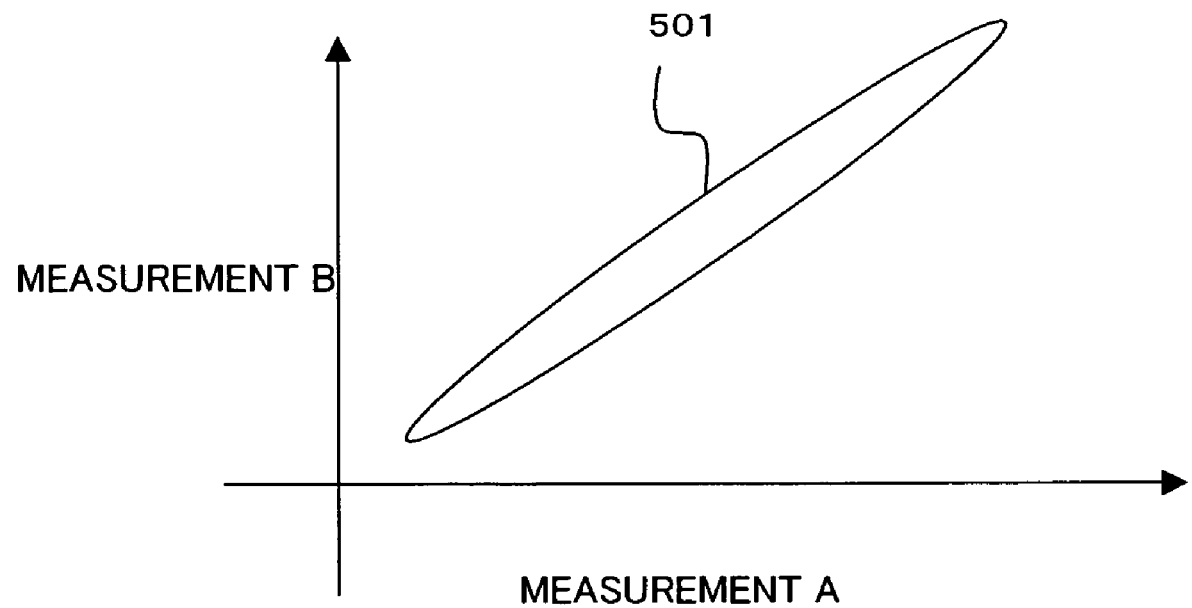
F I G. 5

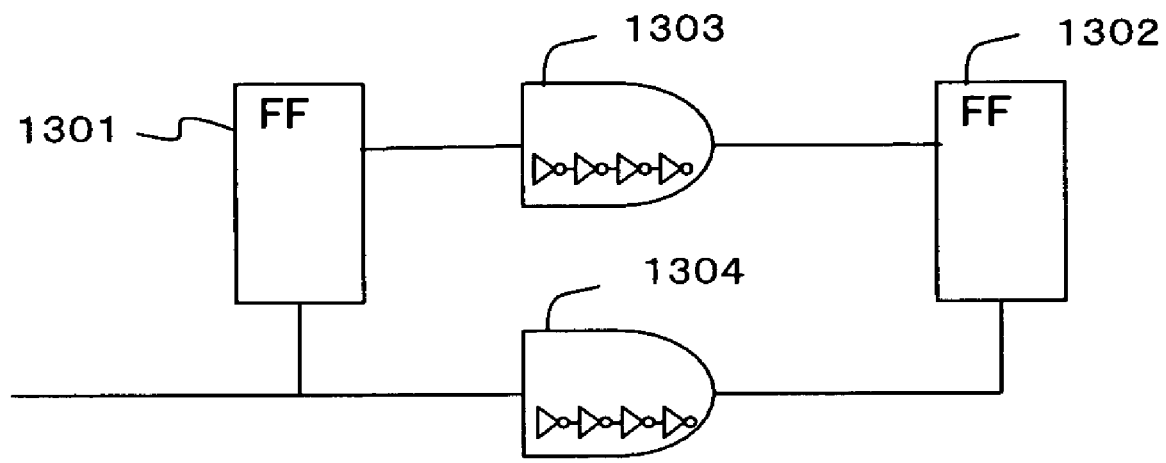
F I G. 1 3

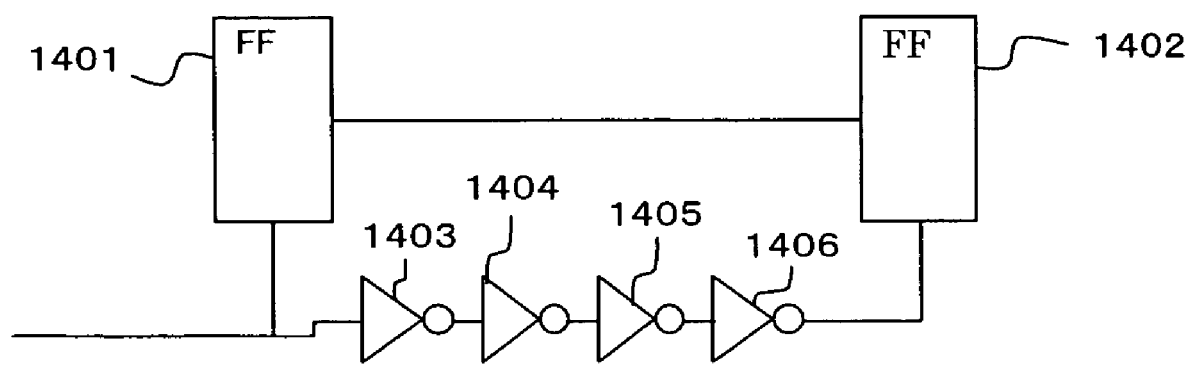
F I G. 1 4

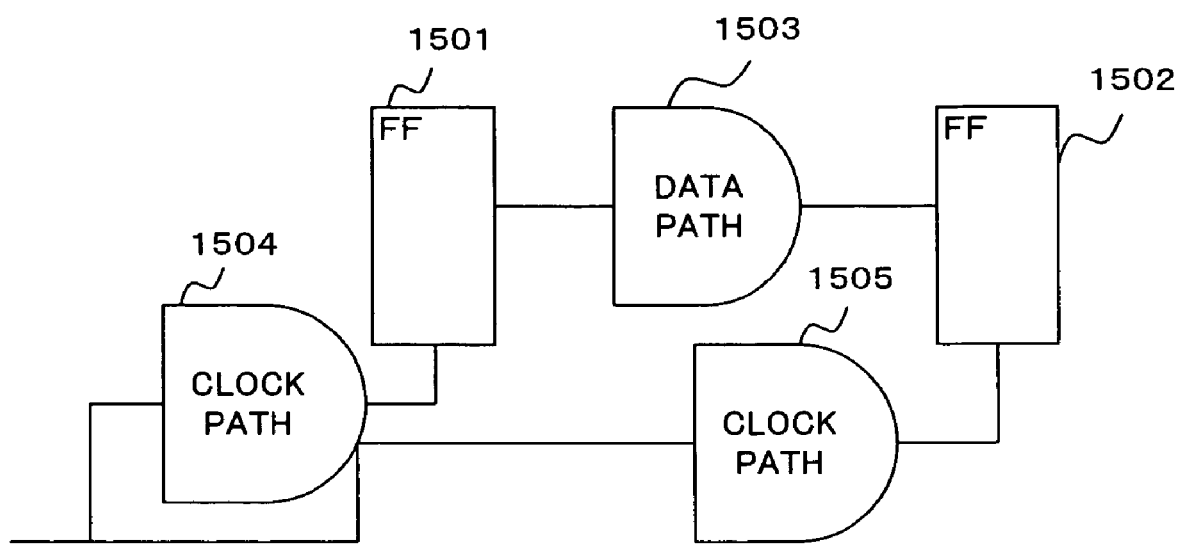
F I G. 1 5

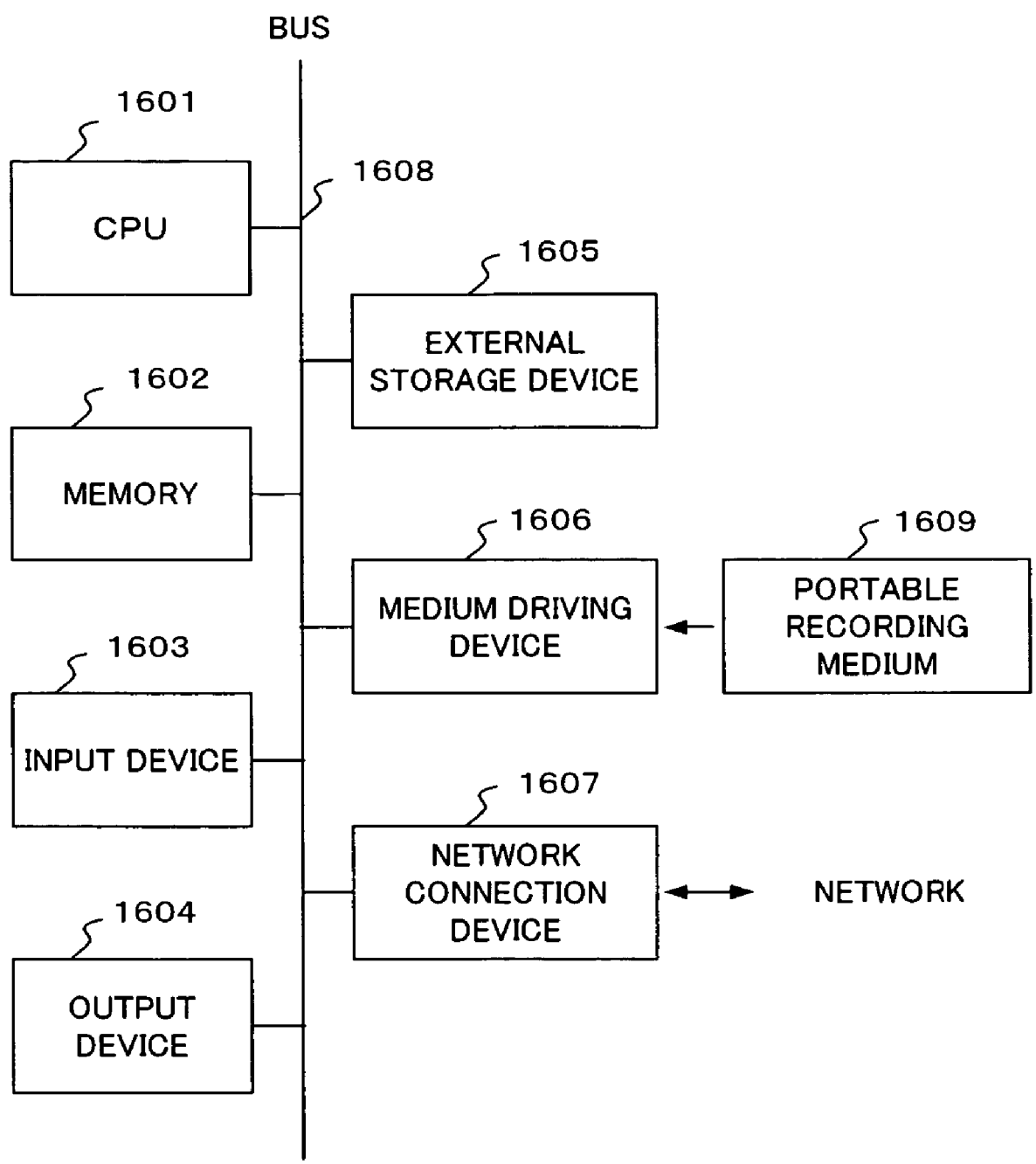
F I G. 1 6

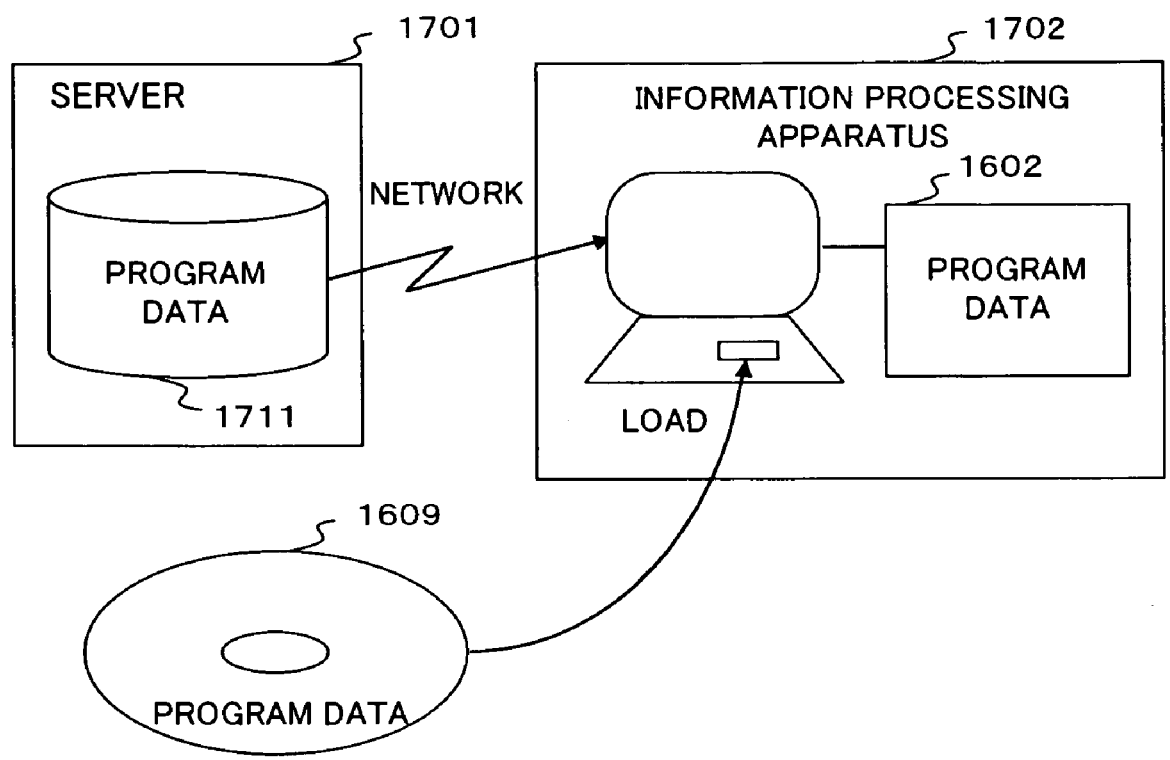
F I G. 17

TIMING ANALYZER APPARATUS AND TIMING ANALYSIS PROGRAM RECORDING MEDIUM

CROSS REFERENCE TO RELATED APPLICATIONS

This application is based upon and claims the benefit of priority from the prior Japanese Patent Application No. 2005-343640, filed Nov. 29, 2005, the entire contents of which are incorporated herein by this reference.

BACKGROUND OF THE INVENTION

1. Field of the Invention

The present invention relates to an apparatus for performing a timing analysis of a circuit in designing a semiconductor integrated circuit and a program thereof.

2. Description of the Related Art

A static timing analysis (STA), used in conventional semiconductor integrated circuit designing, verifies whether a circuit operates or not within a range between the maximum and the minimum delay values with variations, employing delay average value $\mu$ and standard deviation $\sigma$ of a gate circuit, as shown in FIG. 1A. For example, in a case of a $3\sigma$ model, the timing verification is performed with in a range of the maximum value $\mu+3\sigma$ and the minimum value $\mu-3\sigma$. However, it is rare that only one gate circuit is present in an actual circuit, and therefore, timing verification in a case that a plurality of gate circuits are combined is required.

In the conventional STA, as shown in FIG. 1B, a delay variation margin (also referred to as the standard deviation herein) of a circuit with a line of a plurality of gates is used for calculation of a standard deviation of a whole circuit, employing the standard deviations $\sigma_1$, $\sigma_2$, $\sigma_3$, $\sigma_4$ . . . of each gate circuit (element), by the following equation.

$$\sigma = \sigma_1 + \sigma_2 + \sigma_3 + \sigma_4 + \ldots \quad (1)$$

Suppose the standard deviations of all the elements are equal, for example, delay of n number of the elements is $\sigma = n\sigma_1$.

In the recent statistical STA, calculation of a standard deviation as the whole circuit by the following equation is also being examined (see Patent Document 1 below, for example).

$$\sigma = \sqrt{\sigma_1^2 + \sigma_2^2 + \sigma_4^2 + \sigma_4^2 + \ldots} \quad (2)$$

Patent Document 1:

Japanese Patent Published Application No. 2003-316849

For example, when the standard deviations of all the elements are equal, the delay of n elements can be represented by the following equation.

$$\sigma = \sqrt{n}\sigma_1 \quad (3)$$

However, the above conventional timing analysis has the following problems.

In the timing verification in circuit designing, the variations of a plurality of the elements are simplified; however, the actual variations are not so simple as the variations in timing verification. For example, there is a correlation such that when the delay of an element A is larger than the average value, the delay of an element B is likely to be larger as well. For that reason, the timing verification based on the estimation of the simplified variations, may cause an excess margin or an inadequate margin of the timing, incurring waste of motion or blocking circuit operation.

In the timing verification with the correlation, in general, using a correlation coefficient $r_{AB}$ between the element A and the element B, a term $r_{AB}\sigma_A\sigma_B$ gives a contribution to a variance. Therefore, the variance of a circuit comprising elements A, B, C and others can be expressed by the following equation.

$$\sigma^2 = \sigma_A^2 + \sigma_B^2 + \ldots + 2r_{AB}\sigma_A\sigma_B + 2r_{AC}\sigma_A\sigma_C + 2r_{BC}\sigma_B\sigma_C + \ldots \quad (4)$$

The same variance as expressed above is used in the case of timing verification of a circuit comprising cells A, B, C and others, regarding a cell comprising one or more elements as a single circuit element. However, in recent years, types of cells employed for circuit designing are of great variety, and therefore the combinations of the cells become an enormous number. Therefore, experimentally examining the correlation of all the combinations, or calculating the correlation of a number of paths by a computer involves a great deal of time, and it is not realistic. In addition, it is more important to improve efficiency and performance in semiconductor manufacture rather than to achieve mathematical accuracy.

SUMMARY OF THE INVENTION

It is an object of the present invention to efficiently perform a timing analysis in designing a semiconductor integrated circuit, while reflecting the variations in cell delay more accurately.

The first and the second timing analyzer apparatuses according to the present invention comprise a storage device, a standard deviation calculation device, a delay calculation device, an evaluation value calculation device, a verification device, and an output device.

In the first timing analyzer apparatus, the storage device stores path data indicating a plurality of cells constituting a timing verification target circuit in a semiconductor integrated circuit, delay data and standard deviation data of each cell, a weight for calculating the standard deviation of the delay of the target circuit, and a threshold of timing verification.

The standard deviation calculation device calculates a sum of squares of the standard deviations of the plurality of the cells using the path data and the standard deviation data of each cell, calculates a square root of the sum of squares, and obtains a standard deviation of delay of the target circuit by multiplying the calculated square root by the weight. The delay calculation device calculates delay of the target circuit by using the path data and the delay data of each cell.

An evaluation value calculation device calculates an evaluation value for timing verification by using the standard deviation of delay of the target circuit and the delay of the target circuit, and the verification device performs the timing verification by comparing the evaluation value with the threshold. The output device outputs a verification result.

In the second timing analyzer apparatus, the storage device stores path data indicating n cells constituting a timing verification target circuit in a semiconductor integrated circuit, delay data and a standard deviation $\sigma_i$ ($i=1, 2, \ldots n$) of each cell and a correlation coefficient $r_{ij}$ ($j=1, 2, \ldots, n$, $r_{ii}=1$, $r_{ij}=r_{ji}$) between an i-th cell and a j-th cell and a threshold of timing verification.

The standard deviation calculation device calculates a weighted standard deviation $\Gamma_i$ of n cells by multiplying the standard deviation $\sigma_i$ of the n cells indicated by the path data by a weight $$\sqrt{\sum_{j=1}^{n} r_{ij}}.$$

And the device calculates the sum of squares of the weighted standard deviation $\Gamma_i$ of the n cells, and calculates a square root of the sum of squares as a standard deviation σ of delay of the target circuit. The delay calculation device calculates delay of the target circuit by using the path data and the delay data of each cell.

The evaluation value calculation device calculates an evaluation value for timing verification by using the standard deviation a of delay of the target circuit and the delay of the target circuit, the verification device performs the timing verification by comparing the evaluation value with the threshold. The output device outputs a verification result.

BRIEF DESCRIPTION OF THE DRAWINGS

FIG. 2 is a diagram showing a principle of the timing analyzer apparatus of the present invention;
FIG. 3A is a diagram representing cells connected in series;
FIG. 5 is a diagram showing the first measurement result;
FIG. 13 is a diagram showing a first circuit;
FIG. 14 is a diagram showing a second circuit;
FIG. 15 is a diagram showing a third circuit;
FIG. 16 is a diagram showing a configuration of an information processing apparatus;
and
FIG. 17 is a diagram showing a method for providing programs and data.

DESCRIPTION OF THE PREFERRED EMBODIMENT

Figure 1A:
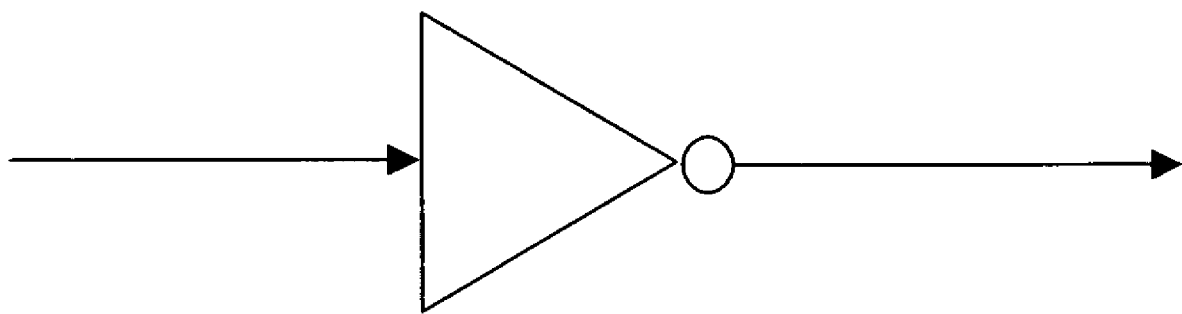
FIG. 1A is a diagram showing a gate circuit.
Figure 1B:
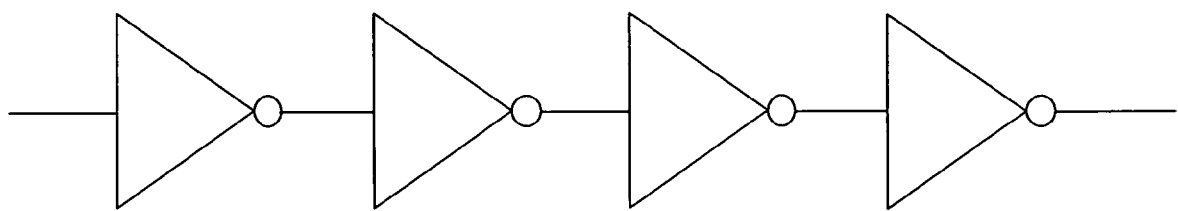
FIG. 1B is a diagram showing a plurality of gate circuits.

In the following description, details of the preferred embodiment of the present invention are set forth with reference to the drawings.

FIG. 2 is a diagram showing a principle of first and second timing analyzer apparatuses of the present invention. The timing analyzer apparatus shown in FIG. 2 comprises a storage device 101, a standard deviation calculation device 102, a delay calculation device 103, an evaluation value calculation device 104, a verification device 105, and an output device 106.

In the first timing analyzer apparatus, the storage device 101 stores a path data indicating a plurality of cells constituting a timing verification target circuit in a semiconductor integrated circuit, delay data and standard deviation data of each cell, a weight for calculating delay of standard deviation of the target circuit, and a threshold of the timing verification.

The standard deviation calculation device 102, using the path data and standard deviation data of each cell, calculates a sum of squares of standard deviations of the plurality of cells, and calculate a square root of the sum of squares. The calculate d square root is multiplied by the weight, and the standard deviation of the delay of the target circuit is obtained. The delay calculation device 103 calculates delay of the target circuit by using path data and the delay data of each cell.

The evaluation value calculation device 104 calculates an evaluation value for timing verification by using the standard deviation of the delay of the target circuit and the delay of the target circuit, and the verification device 105 performs the timing verification by comparing the evaluation value with a threshold. The output device 106 outputs the verification result.

According to the first timing analysis apparatus, the standard deviation of the target circuit is calculated by multiplying the square root of sum of squares of standard deviations of cells constituting the target circuit by a certain weight rather than simply using the square root of the sum of squares as a standard deviation of the target circuit. Therefore, the standard deviation of the target circuit can be set at a value between the equation (1) and the equation (2) by a simple calculation, and by adjusting the weight, variations closer to the actual values can be obtained.

In the second timing analyzer apparatus, the storage device 101 stores path data indicating n cells constituting a timing verification target circuit in a semiconductor integrated circuit, delay data and the standard deviation $\sigma_i$ (i=1, 2, . . . , n) of each cell, a correlation coefficient $r_{ij}$ (j=1, 2, . . . , n, $r_{ii}$=1, $r_{ij=rji}$) between the i-th cell and the j-th cell, and a threshold of the timing verification.

The standard deviation calculation device 102 multiplies the standard deviation $\sigma_i$ of n number cells indicated by the path data by the weight $$\sqrt{\sum_{j=1}^{n} r_{ij}}$$

and calculates a weighted standard deviation $\Gamma_i$ of the n cells. The sum of the squares are calculated, the square root of the calculated sum of squares is obtained as the standard deviation σ of the delay of the target circuit. The delay calculation device 103 calculates delay of the target circuit by using the path data and the delay data of each cell.

The evaluation value calculation device 104 calculates the evaluation value for the timing verification by using the standard deviation σ of the delay of the target circuit and the delay of the target circuit, and the verification device 105 performs timing verification by comparing the evaluation value with a threshold. The output device 106 outputs the verification result.

According to the second timing analyzer apparatus, the square root of the sum of squares of weighted standard deviations of cells constituting the target circuit is calculated as the standard deviation of the target circuit rather than simply using the square root of the sum of squares of standard deviations of the cells as a standard deviation of the target circuit. Therefore, the standard deviation of the target circuit can be set at a value between the equation (1) and the equation (2) by a simple weighting process, and by adjusting the weight, variations closer to the actual values can be obtained.

The storage device 101 corresponds to, for example, memory 1602 or an external storage device 1605 in FIG. 16 explained later, the standard deviation calculation device 102, the delay calculation device 103, the evaluation value calculation device 104, and the verification device 105 corresponds to a CPU (Central Processing Unit) 1601 in FIG. 16, for example. The output device 106 corresponds to an output device 1604 in FIG. 16, for example.

According to the present invention, in designing and manufacturing of a semiconductor integrated circuit, a timing margin can be set at an appropriate value without modifying conventional tools or systems, and performance gain and cost reduction can be achieved without causing operational troubles in the circuit.

With recent improvement of processing capacity of computers and development of tools, further accurate margin can be set in accordance with the processing capacity.

In addition, it is possible to develop tools for calculating a margin with higher accuracy than the conventional margins.

The correlation coefficient employed in the present embodiment is to be examined. When a plurality of types of cells are present as delay measurement targets, the average value and the standard deviation of the measurement of the sum or the difference in the delay of the cells can be represented by an equation.

When measuring the delay N times for each of a cell A and a cell B shown in FIG. 3A, the measured values obtained at h-th measurement are represented as $A_h$ and $B_h$. For example, the measurement of respective cells at the same position for N chips aligned on a single wafer corresponds to the measurement of N times. In such a case, the average values of the delay of each cell $\mu_A$ and $\mu_B$ are represented by the following equation.

$$\mu_A = \frac{1}{N}\sum_{h=1}^{N} A_h, \; \mu_B = \frac{1}{N}\sum_{h=1}^{N} B_h \quad (5)$$

Next, the measurement of the sum is considered. The delay of h-th (h=1, 2, ..., N) measurement, when connecting the cell A and cell B in series as in FIG. 3A, is represented as $A_h + B_h$, and the average value is represented as $\mu = \mu_A + \mu_B$. At this point, the following vectors with "variations in measured value from the average value" as components are examined.

$$\vec{A} = (A_1 - \mu_A, A_2 - \mu_A, A_3 - \mu_A, A_4 - \mu_A, A_5 - \mu_A, A_6 - \mu_A, A_7 - \mu_A,$$
$$\ldots, A_N - \mu_A)/\sqrt{\sqrt{N}}$$

$$\vec{B} = (B_1 - \mu_B, B_2 - \mu_B, B_3 - \mu_B, B_4 - \mu_B, B_5 - \mu_B, B_6 - \mu_B, B_7 - \mu_B,$$
$$\ldots, B_N - \mu_B)/\sqrt{\sqrt{N}} \quad (6)$$

Figure 3B:
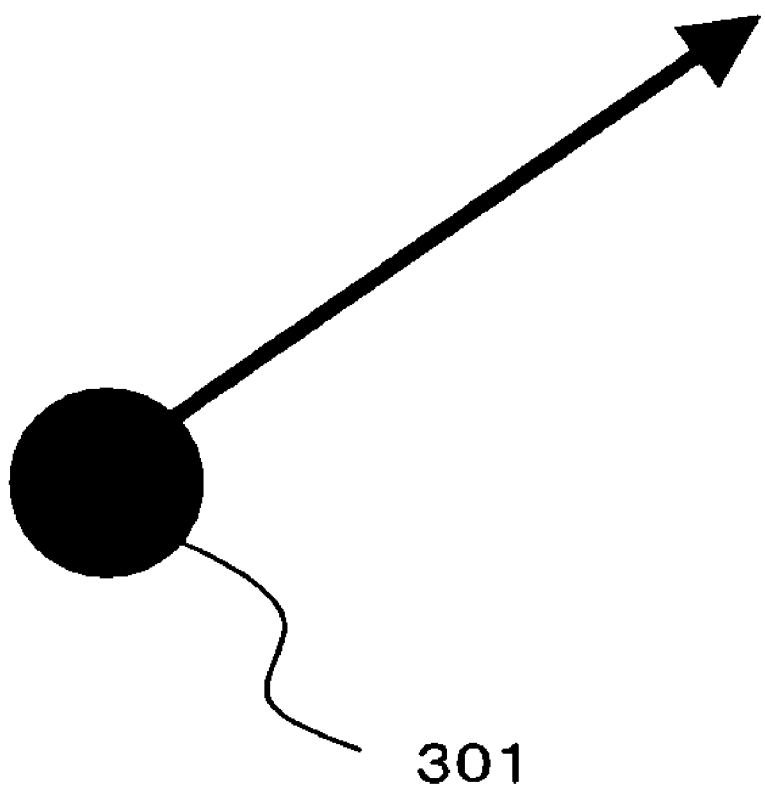
FIG. 3B is a diagram showing a variation vector.

Such vectors are hereinafter referred to as variation vectors. These variation vectors are N-dimensional vectors as shown in FIG. 3B, having a delay average value as a vector origin 301, and variations from the average value as components. When the variation vector is obtained for the measurement of the sum, it is $$\vec{A} + \vec{B}$$

and it can be expressed in a form of the sum of two vectors. The standard deviation is the length of the variation vector by the definition.

$$\sigma_A = |\vec{A}|, \; \sigma_B = |\vec{B}| \quad (7)$$

By examining the standard deviation $\sigma$ of the measurement of the sum, at this point, the following equation can be obtained.

$$\sigma^2 = |\vec{A} + \vec{B}|^2 \quad (8)$$
$$= |\vec{A}|^2 + |\vec{B}|^2 + 2\vec{A} \cdot \vec{B}$$
$$= |\vec{A}|^2 + |\vec{B}|^2 + 2|\vec{A}||\vec{B}|\cos\theta$$
$$= \sigma_A^2 + \sigma_B^2 + 2\sigma_A\sigma_B\cos\theta$$

Therefore, the standard deviation as a whole can be represented by using each standard deviation of two measurement targets and an angle $\theta$ between variation vectors.

The $\cos\theta$ in the above equation represents a correlation of the variation between the cell A and the cell B, and is referred to as a correlation coefficient.

$$r_{AB} = \cos\theta \quad (9)$$

Figure 4:
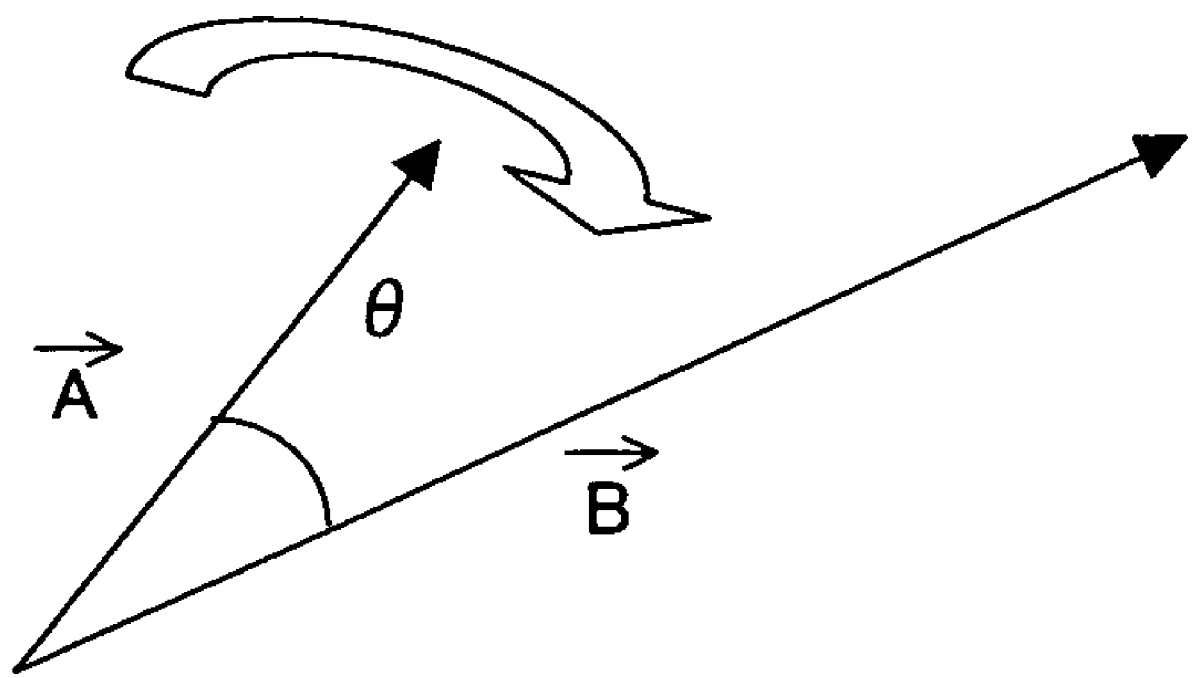
FIG. 4 is a diagram showing perfect positive correlation.

As shown in FIG. 4, in a state that $\theta$ is close to 0, that is when directions of the two vectors are approximately parallel, the N-times measurement results plotted on a two-dimensional plane would appear as in FIG. 5. The horizontal axis and the vertical axis indicate measured values of the cell A and the cell B, respectively.

In the plotting result in FIG. 5, N-times measurement results range within an area 501. This result shows a tendency that when a measured value of the cell A deviates from the average value at any one measurement, a measured value of the cell B would as well deviate from the average value, proving a strong correlation of the variations between two cells.

Comparing this correlation to the delay of elements, when a gate length of an element is longer than the designed value, the gate length of all elements on the chip become longer as well. Thus, there is a tendency that, when the delay is greater than the average value, the delay of the other elements becomes greater. In particular, $r_{AB}=1$ ($\theta=0$) is referred to as a perfect positive correlation.

Figure 6:
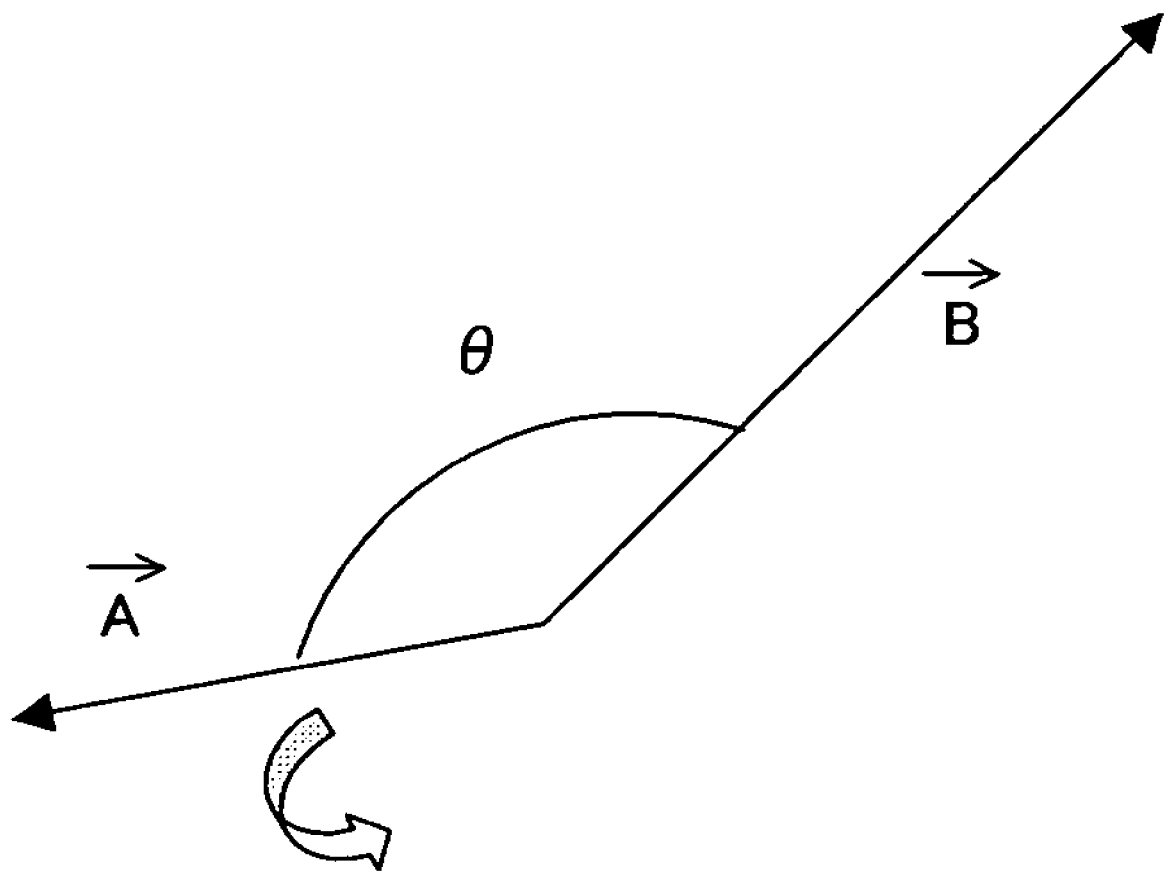
FIG. 6 is a diagram showing perfect negative correlation.
Figure 7:
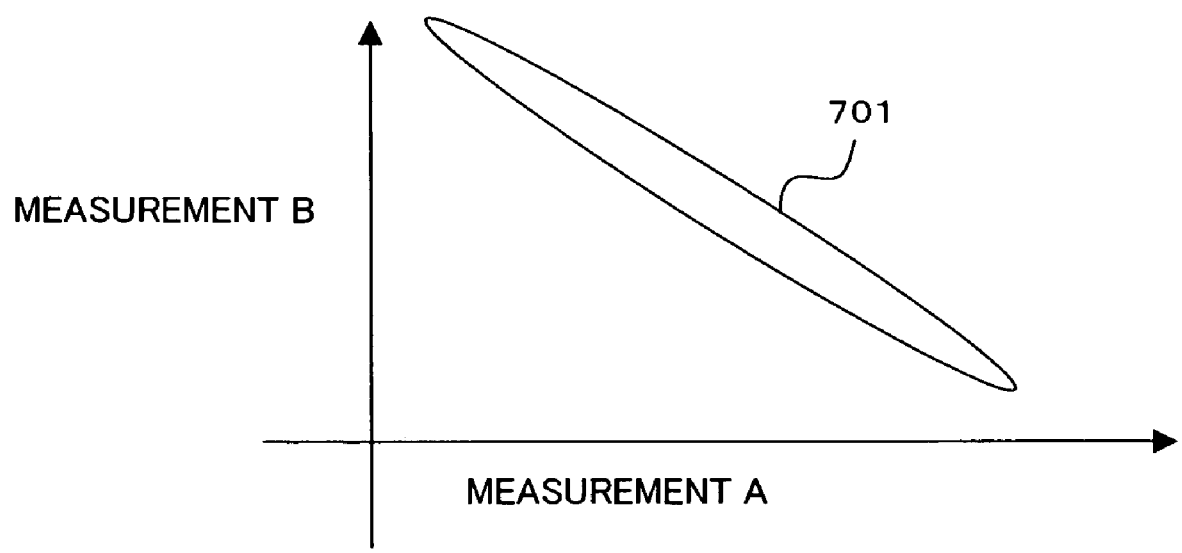
FIG. 7 is a diagram showing the second measurement result.

Next, as shown in FIG. 6, in a state that $\theta$ is close to $\Pi$, that is when directions of the two vectors approximately opposite to each other, the N-times measurement results would appear as in FIG. 7. In the plotting result in FIG. 7, N-times measurement results range within an area 701. This result shows a tendency that when a measured value of the cell A deviates from the average value at any one measurement, a measured value of the cell B would deviate from the average value in the opposite direction, which cancels the variation of the cell A. Hence, the result proves, in this case also, a strong correlation of the variations between two cells. Particularly, $r_{AB}=-1$ ($\theta=\Pi$) is referred to as a perfect negative correlation.

Figure 8:
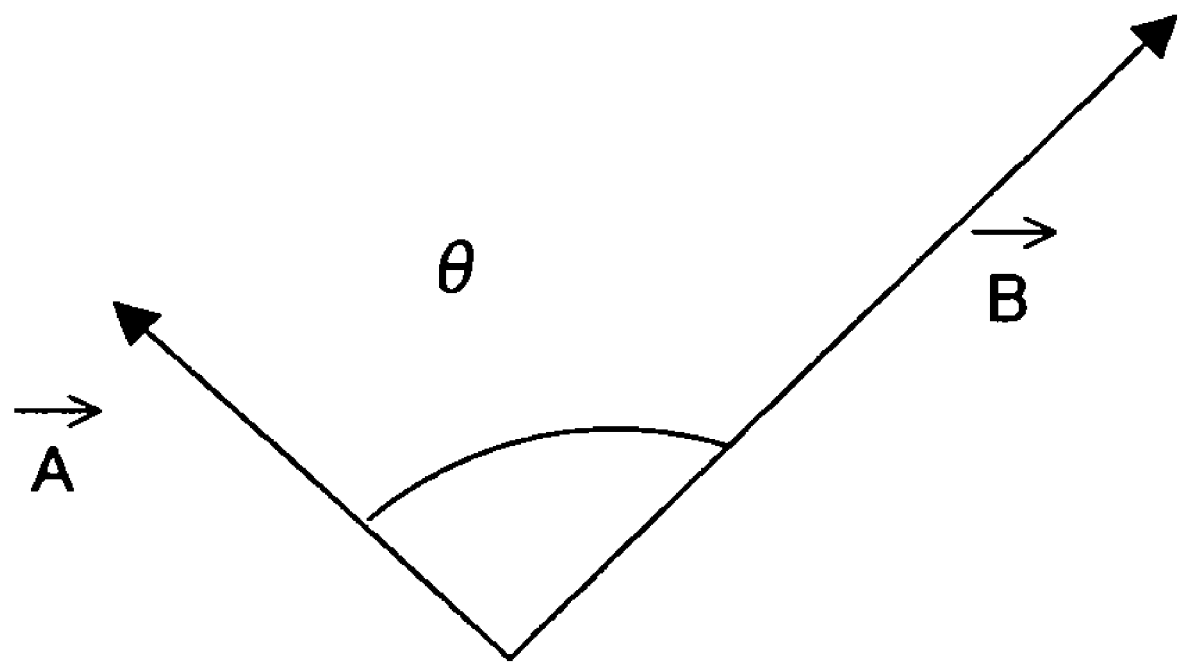
FIG. 8 is a diagram showing non-correlation.
Figure 9:
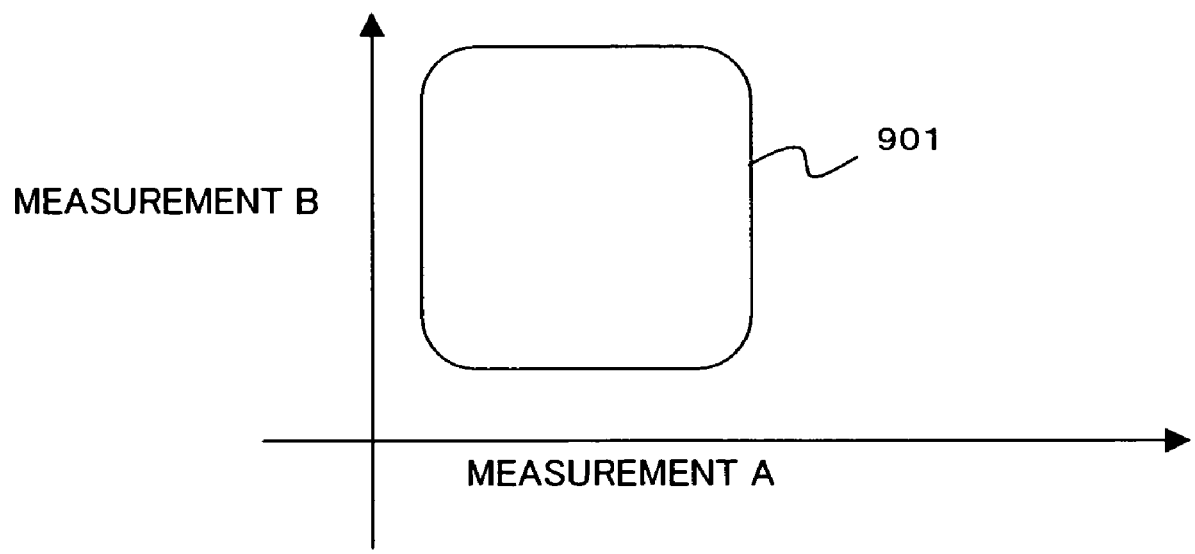
FIG. 9 is a diagram showing the third measurement result.

Next, as shown in FIG. 8, in a state that $\theta$ is close to $\Pi/2$, that is when directions of the two vectors are approximately orthogonal, the N-times measurement results would appear as in FIG. 9. In the plotting result in FIG. 9, N-times measurement results range within an area 901. This result shows that when a measured value of the cell A deviates from the average value at any one measurement, overall, a measured value of the cell B tends not to deviate from the average value in the same direction as that of the cell A. In other words, the variation is random regardless of the variation of the cell A.

This correlation corresponds the absence of a tendency that when the delay changes dues to the variations of diffusion of transistors, the variation of the delay is element dependent. In particular, $r_{AB}=0$ ($\theta=\Pi/2$) is referred to as a non-correlation.

Using the above correlation coefficient $r_{AB}$, the standard deviation $\sigma$ of the delay of a circuit comprising n cells A, B, C, D, ... is examined.

$$\sigma^2 = |\vec{A} + \vec{B} + \vec{C} + \vec{D} + \cdots|^2 \quad (10)$$
$$= \sigma_A^2 + \sigma_B^2 + \cdots + 2r_{AB}\sigma_A\sigma_B + 2r_{AC}\sigma_A\sigma_C + 2r_{BC}\sigma_B\sigma_C + \cdots$$

Because a commutation relation $r_{AB}=r_{BA}$ is obviously true, and the autocorrelation is the correlation between the same variation vectors, it is proved that $\theta=0 \Leftrightarrow r_{AA}=1$ etc. Therefore, by using the correlation coefficient including the case of autocorrelation, the variance can be represented as following.

$$\sigma^2 = \sum_{j=1}^{n}\sum_{i=1}^{n} r_{ij}\sigma_i\sigma_j \quad (11)$$

Note that in the above equation, the standard deviations of each cell are represented as $\sigma_i$, $\sigma_j$, (i, j=1, 2, . . . , n) for descriptive purposes, and the correlation coefficients of the cell i and the cell j are represented by $r_{ij}$. Then, the summation with respect to the cells A, B, C, D, . . . is replaced by the summation with respect to i and j. According to this equation, by calculating a real symmetric matrix (correlation matrix) $r_{ij}$ where the all diagonal components are 1, and the off-diagonal components are between −1 and 1, the varation as a whole circuit can be obtained.

Figure 10:
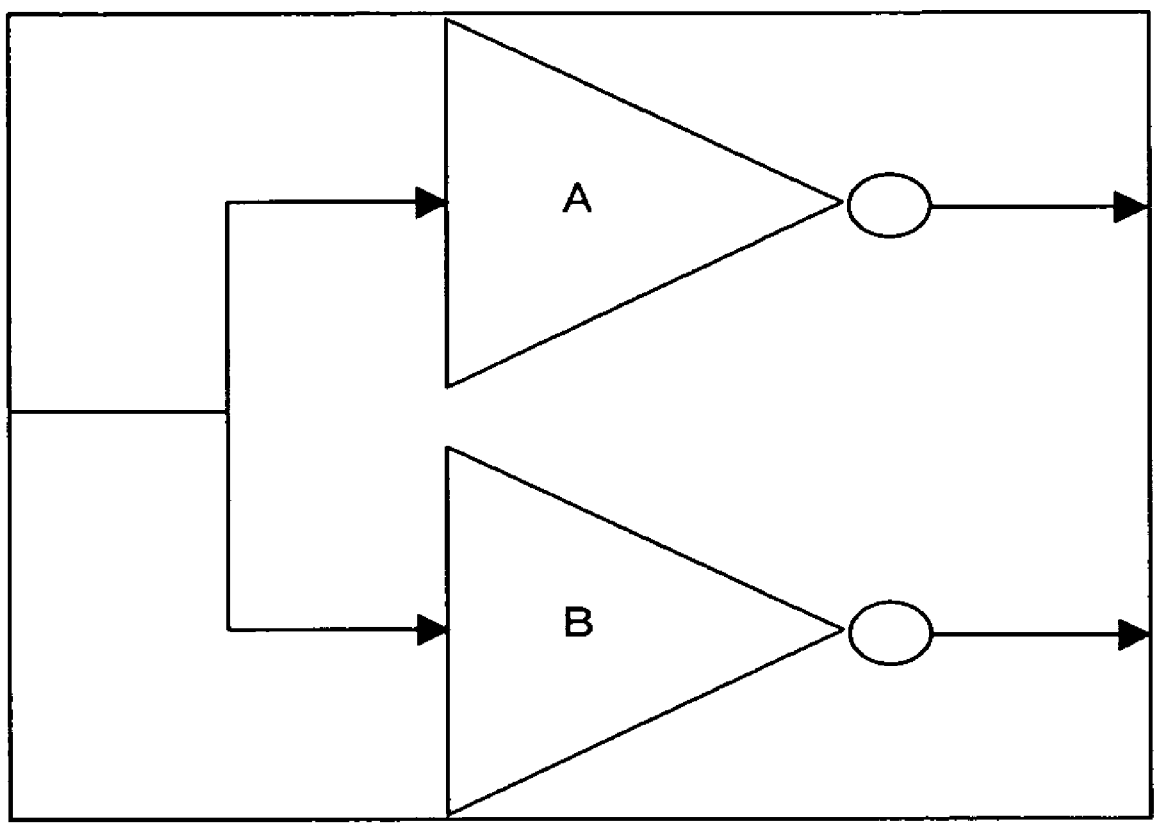
FIG. 10 is a diagram showing cells connected in parallel.

Next, measurement of the difference is examined. For example, the difference in output delay at the h-th measurement (h=1, 2, . . . , N) when the cell A and the cell B are connected in parallel as shown in FIG. 10 is represented as $A_h-B_h$, and its average value is represented as $\mu=\mu_A-\mu_B$. In this case also, like the measurement of the sum, the following equation can be obtained for the standard deviation σ.

$$\sigma^2 = |\vec{A} - \vec{B}|^2 \quad (12)$$
$$= |\vec{A}|^2 + |\vec{B}|^2 - 2\vec{A}\cdot\vec{B}$$
$$= |\vec{A}|^2 + |\vec{B}|^2 - 2|\vec{A}||\vec{B}|\cos\theta$$
$$= \sigma_A^2 + \sigma_B^2 - 2\sigma_A\sigma_B\cos\theta$$

When the measurements of the cell A and the cell B has the relation of the difference, it is possible to formulate the relation in the same form as the measurement of the sum by replacing the correlation coefficient $r_{AB}$ by $-r_{AB}$. Consequently, a generalized equation as following can be used for both the measurement of the sum and the measurement of the difference.

$$\sigma^2 = \sum_{j=1}^{n}\sum_{i=1}^{n} r_{ij}\sigma_i\sigma_j \quad (r_{ii}=1, r_{ij}=r_{ji}, -1 \le r_{ij} \le 1) \quad (13)$$

The following modification of the equation proves that the conventional timing analysis has replaced all $r_{ij}$ in the generalized equation by 1.

$$\sigma^2 = \sum_{j=1}^{n}\sum_{i=1}^{n} r_{ij}\sigma_i\sigma_j = \quad (14)$$

-continued
$$\sum_{j=1}^{n}\sum_{i=1}^{n} \sigma_i\sigma_j = \sum_{j=1}^{n}\sigma_j \sum_{i=1}^{n}\sigma_i = \left(\sum_{i=1}^{n}\sigma_i\right)^2 \Leftrightarrow \sigma = \sum_{i=1}^{n}\sigma_i$$

In other words, the conventional timing analysis regards all variations as perfect positive correlation, and performs timing verification. This method is adequate for taking margins. However, in recent years, as technologies advance and elements are miniaturized, the variation without correlation (such as the variation in delays among the same elements in a chip) becomes greater than the variation with correlation (referred to as a system variation such as gate length). For that reason, to regard all variations as perfect positive correlation is to set an excess margin, causing difficulty in designing, unnecessary increase in a chip size, and increase in cost.

The method often employed in the statistical STA is equivalent to setting $r_{ii}=1$ and $r_{ij}=0$ (i≠j). In fact, when $r_{ij}$ in the equation (14) is replaced by a unit matrix $\delta_{ij}$, the following equation can be obtained.

$$\sigma^2 = \sum_{j=1}^{n}\sum_{i=1}^{n} r_{ij}\sigma_i\sigma_j = \sum_{j=1}^{n}\sum_{i=1}^{n} \delta_{ij}\sigma_i\sigma_j = \sum_{j=1}^{n}\sigma_j^2 \quad (15)$$

In other words, this equation calculates the variation regarding every correlation between cells as non-correlation. With this method, if any correlation is present, the margin becomes insufficient. The variations occurring in the semiconductor manufacture process, indeed, are not only completely random variations, and therefore, the design has inadequate margins, causing reduction in yield.

Ideally, it is desirable to fully estimate the correlation matrix $r_{ij}$ and to calculate a precise standard deviation of a circuit. However, as explained above, it is a great difficulty to measure and calculate the correlation between all elements in advance. Even if the correlation matrix can be determined, it would require an immense amount of time to calculate the correlations in a large-scale circuit.

In view of this problem, the present embodiment employs a method, which allows to narrow down the timing margin without making the margin inadequate and to calculate the variation within practical calculation time. In so doing, the following weighting factor $k_{ij}$ is introduced.

$$k_{ij} = \frac{2r_{ij}\sigma_i\sigma_j}{\sigma_i^2 + \sigma_j^2} \quad (k_{ii}=1, k_{ij}=k_{ji}, |k_{ij}| \le |r_{ij}| \le 1) \quad (16)$$

By using the weighting factor, the equation (13) can be represented as below.

$$\sigma^2 = \sum_{j=1}^{n}\sum_{i=1}^{n} r_{ij}\sigma_i\sigma_j = \sum_{j=1}^{n}\sum_{i=1}^{n} \frac{1}{2}k_{ij}(\sigma_i^2+\sigma_j^2) = \sum_{j=1}^{n}\left(\sum_{i=1}^{n} k_{ij}\right)\sigma_j^2 \quad (17)$$

At this point, the standard deviation $\Gamma_j$ weighted by using $k_{ij}$ can be defined by $$\Gamma_j = \sqrt{\sum_{i=1}^{n} k_{ij}} \, \sigma_j \quad (18)$$

Then, the equation (17) can be represented as the following.

$$\sigma^2 = \sum_{j=1}^{n} \Gamma_j^2 \quad (19)$$

According to the equation (19), the variance as the whole circuit can be represented by a sum of squares of the weighted standard deviations of respective cells.

Next, the property of the weighting factor $k_{ij}$ is explained.

[1] When the difference between two standard deviations $\sigma_i$ and $\sigma_j$ is large, $k_{ij}$ is estimated as below.

$$k_{ij} \cong \frac{2 r_{ij} \sigma_i}{\sigma_j} \cong 0, \, (\sigma_i << \sigma_j) \quad (20)$$

Then, the correlation hardly gives a contribution to the variations.

[2] From relation between the arithmetic average and geometric average (arithmetic average≧geometric average) of the two standard deviations $\sigma_i$ and $\sigma_j$, $|k_{ij}| \leq |r_{ij}| \leq 1$ is obtained. When $|k_{ij}| \to |r_{ij}|$, the variation can be calculated with adequate margin. Note that $|k_{ij}|=|r_{ij}|$ is true only when two standard deviations are equal.

The following equation can be obtained by expanding $k_{ij}$ with respect to the two standard deviations.

$$k_{ij} = r_{ij} \left( \begin{array}{c} \frac{2\sigma_i \sigma_j}{\sigma_i^2 + \sigma_j^2} + \frac{2\sigma_j(\sigma_j^2 - \sigma_i^2)}{(\sigma_i^2 + \sigma_j^2)^2} d\sigma_i + \frac{2\sigma_i(\sigma_i^2 - \sigma_j^2)}{(\sigma_i^2 + \sigma_j^2)^2} d\sigma_j + \\ \frac{4\sigma_i \sigma_j(\sigma_i^2 - 3\sigma_j^2)}{(\sigma_i^2 + \sigma_j^2)^3} d\sigma_i^2 + \frac{4\sigma_i \sigma_j(\sigma_j^2 - 3\sigma_i^2)}{(\sigma_i^2 + \sigma_j^2)^3} d\sigma_j^2 + \\ \frac{4(6\sigma_i^2 \sigma_j^2 - \sigma_i^4 - \sigma_j^4)}{(\sigma_i^2 + \sigma_j^2)^3} d\sigma_i d\sigma_j + \ldots \end{array} \right) \quad (21)$$

When $\sigma = \sigma_i = \sigma_j$, $d\sigma = d\sigma_i$, $d\sigma_j = 0$ are assigned in order to examine the difference from a case that two standard deviations are equal, $$k_{ij} = r_{ij} \left( 1 - \left( \frac{d\sigma}{\sigma} \right)^2 + \ldots \right) \quad (22)$$

is obtained.

[3] If the difference between the two standard deviations $\sigma_i$ and $\sigma_j$ can be ignored in the second order, according to the equation (22), the weighting factor $k_{ij}$ equals to the correlation coefficient $r_{ij}$.

By assuming that the difference between the two standard deviations is adequately small based in such property of the weighting factor $k_{ij}$, it is possible to derive a calculation method replacing $k_{ij}$ by $r_{ij}$ in the equation (19). In such a case, the equation (18) and the equation (19) are replaced as described below.

$$\Gamma_i = \sigma_i \sqrt{\sum_{j=1}^{n} r_{ij}} \quad (r_{ii}=1, r_{ij}=r_{ji}) \quad (23)$$

$$\sigma = \sqrt{\sum_{i=1}^{n} \Gamma_i^2} \quad (24)$$

This method allows to set the standard deviation of a circuit at a value between the conventional equation (1) and equation (2) with less calculation amount required than the equation (18) and the equation (19), and therefore, it is possible to acquire the variation close to an actual value. This calculation method includes the following modifications.

(a) The coefficient of $\sigma_j$ in the equation (23) is replaced by a constant weight X regardless of the cell types, and the standard deviation is calculated by the equation below.

$$\sigma = X \sqrt{\sigma_1^2 + \sigma_2^2 + \sigma_3^2 + \sigma_4^2 + \ldots} \quad (25)$$

(b) Correlations under various conditions are experimentally measured, the maximum value of the correlation coefficient of the cells classified into a plurality of types is estimated as $r_{max}$, and the standard deviation is calculated by replacing the correlation coefficient with a constant value $r_{max}$.

(c) A distance where correlation between cells is valid is experimentally measured, n is assigned to the maximum number of the adjacent cells present within the distance, and the correlation is introduced only to those cells.

(d) Combining the above method (a) and method (b), $r_{ij}$ ($i \neq j$) in the equation (23) is replaced by $r_{max}$, and the standard deviation is calculated by the following equation.

$$\sigma = \sqrt{1+(n-1)r_{max}} \sqrt{\sigma_1^2 + \sigma_2^2 + \sigma_3^2 + \sigma_4^2 + \ldots} \quad (26)$$

(e) The n cells are classified into a plurality of sets each comprising the cells with close standard deviations, and the standard deviation is calculated by the following equation using the maximum value m of the number of elements in the sets.

$$\sigma = \sqrt{1+(m-1)r_{max}} \sqrt{\sigma_1^2 + \sigma_2^2 + \sigma_3^2 + \sigma_4^2 + \ldots} \quad (26)$$

(f) When the evaluation value as the whole circuit, which is a target of timing verification, is equal to the difference between two measured values of the cell i and the cell j, the standard deviation is calculated by replacing the correlation coefficient $r_{ij}$ by $-r_{ij}$.

(g) The standard deviation is calculated by the above equation (23) and equation (24). Only when the target of the timing verification is the difference between the measured values, like the method (f), the correlation coefficient $r_{ij}$ is replaced by $-r_{ij}$.

(h) In the above methods (b)-(g), when the difference between the two standard deviations $\sigma_i$ and $\sigma_j$ is so large that $$r_{ij} >> \frac{\sigma_i}{\sigma_j}, \, (\sigma_i << \sigma_j) \quad (28)$$

holds, the standard deviation is calculated by setting $r_{ij}$, $r_{max}=0$.

According to the above methods (a)-(e), as the equation (23) and the equation (24) can be converted into more simple calculations, the calculation time required for timing analysis can be reduced, and program development is facilitated.

According to the above method (f), the cells connected in parallel can be included in the same calculation in addition to the cells connected in series.

According to the above method (g), compared with the methods (a)-(e), further detailed correlation can be introduced, and consequently, the variation closer to the actual value can be calculated.

According to the above method (h), by setting the correlation coefficient between cells having little correlation at 0, it is possible to calculate the variation in more accurate and simple way.

Next, timing analyses based on the above calculation methods are explained with reference to FIG. 11 through FIG. 15.

Figure 11:
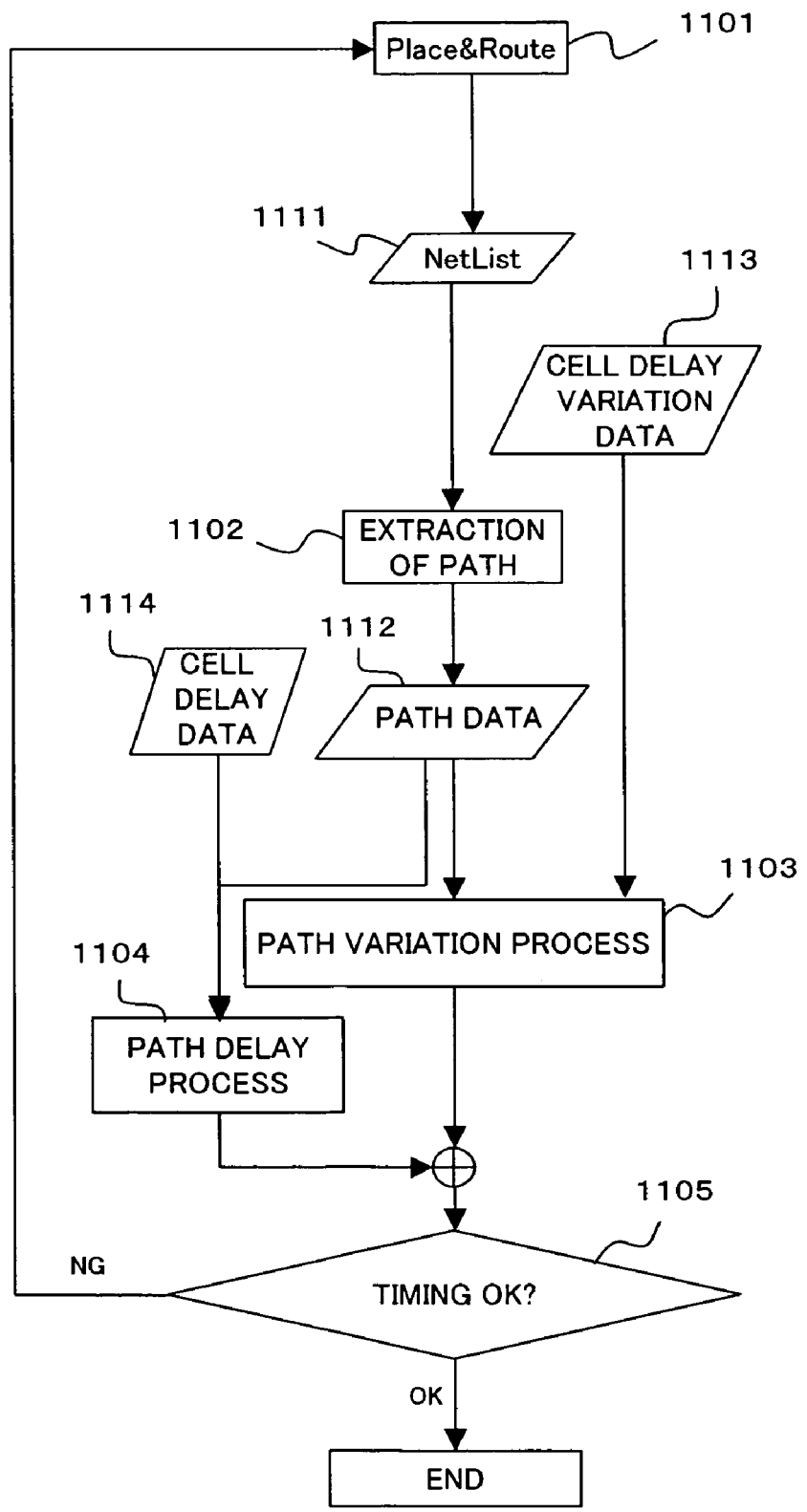
FIG. 11 is a flowchart showing a timing analysis.

FIG. 11 is a flowchart showing an example of a timing analysis performed by the timing analyzer apparatus of the embodiment. As explained later, the timing analyzer apparatus comprises a computer executing an analysis program, for example.

The timing analyzer apparatus, first, arranges a plurality of cells, which are targets of the timing analysis, and performs pattern wiring. By so doing, the apparatus generates a net list 1111 (step 1101). Next, one path or more to be a target of the timing verification is extracted from the generated net list 1111, and path data 1112 is generated (step 1102).

Then, path variation process is performed, using the path data 1112 and delay variation data (standard deviation data) 1113 of each cell, and the standard deviation of the timing verification target circuit is calculated (step 1103). Also, path delay process is performed, using the path data 1112 and delay data 1114, and the delays of each path are calculated (step 1104).

Next, using the standard deviation calculated by the path variation process and the delays for respective paths calculated by the path delay process, timing verification is performed (step 1105). At this step, the evaluation value in accordance with the purpose of the timing verification is calculated, and the timing verification is performed by comparing the evaluated value with a predetermined threshold. When the verification result is NG (No Good), the processes from step 1101 and after are repeated, and when the verification result is OK, the process is to be terminated.

Figure 12:
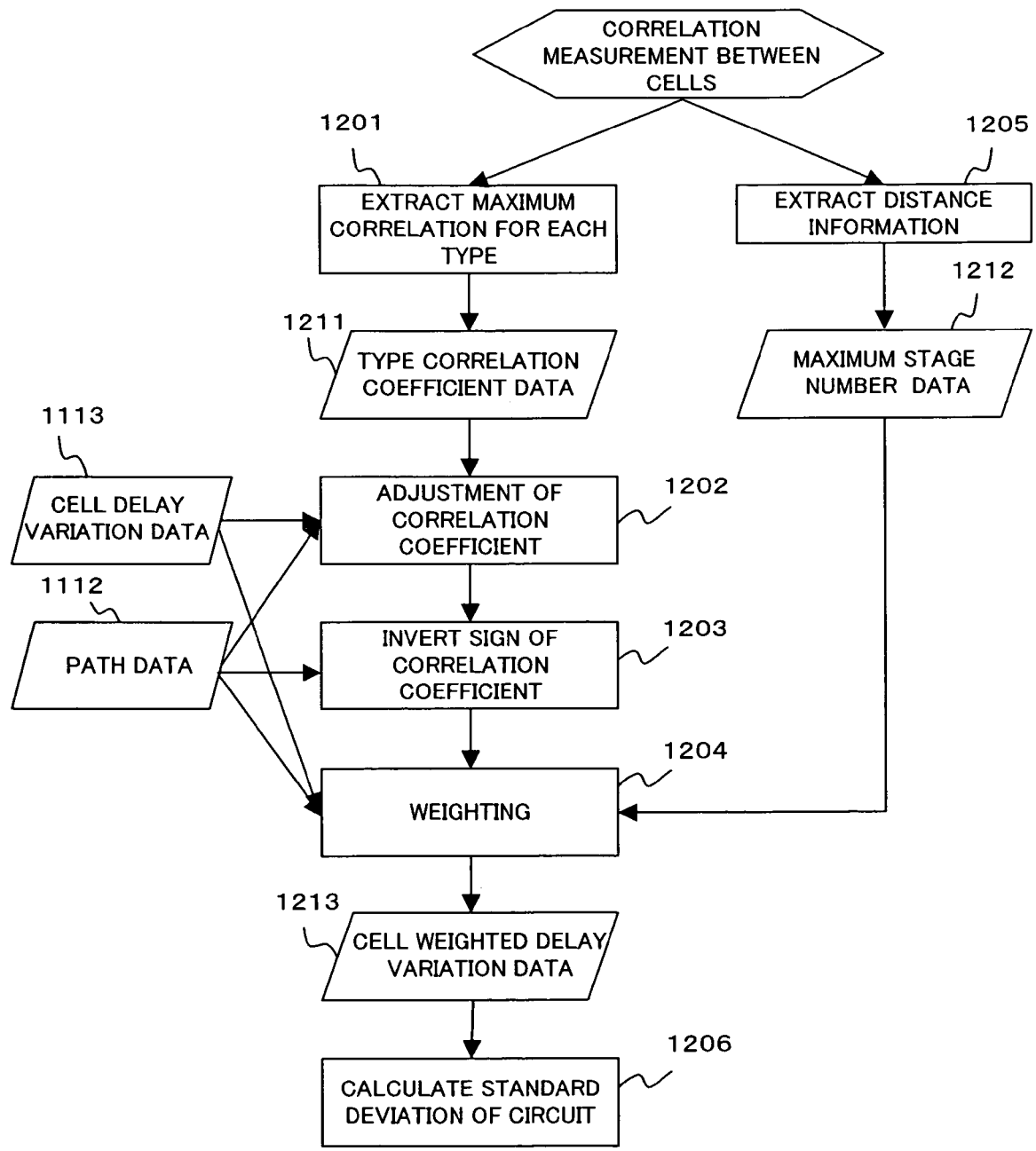
FIG. 12 is a flowchart of the path variation process.

FIG. 12 is a flowchart of the path variation process performed in step 1103 of FIG. 11. The processes in steps 1201, 1202, 1203 and 1205 of FIG. 12 correspond to the above methods (b), (h), (f), and (c), respectively. The processes in steps 1204 and 1206 correspond to the above methods (d), (e) or (g).

The timing analyzer apparatus, first, experimentally measures the correlation between cells, classifies the cells into a plurality of types, calculates the maximum value $r_{max}$ of the correlation coefficient between the cells in respective types, and generates type correlation coefficient data 1211 (step 1201). In this embodiment, the correlation between the cells is measured by using a DMA (Device Matrix Array), which is an evaluation chip carrying a number of elements.

From the measurement result, a distance where correlation between the cells is valid is also calculated, and maximum stage number data 1212, representing the maximum number of stages of cells in accordance with the calculated distance, is generated (step 1205).

Subsequently, using the type correlation coefficient data 1211, the path data 1112, and the delay variation data 1113 for each cell, adjustment of the correlation coefficient (step 1202) and inversion of the correlation coefficient (step 1203) are performed.

In step 1202, it is determined whether the standard deviations $\sigma_i$ and $\sigma_j$ of all combinations of the two cells in the target circuit meet the conditions in the equation (28) or not. When the conditions are met, the corresponding correlation coefficient $r_{ij}$ is changed to 0, and when the conditions are not met, the correlation coefficient $r_{ij}$ is not changed.

In step 1203, it is determined whether all the combinations of the two cells in the target circuit is in the relation of measurement of the sum (in series) or in the relation of measurement of the difference (in parallel). When the relation is in the measurement of the sum, the correlation coefficient $r_{ij}$ is not changed, and when the relation is in the measurement of the difference, the correlation coefficient $r_{ij}$ is changed to $-r_{ij}$.

FIG. 13 shows an example of a circuit to which the above processes are applied. This circuit comprises two flip-flops (FF) 1301 and 1302, a data path 1303, and a clock path 1304. Each of the data path 1303 and the clock path 1304 comprises a plurality of cells. In the timing verification between the flip-flop 1301 and the flip-flop 1302, the correlation coefficient $r_{ij}$ between a cell i in the data path 1303 and a cell j in the clock path 1304 having a parallel relation is replaced by $-r_{ij}$.

Next, the standard deviations of each cell is weighted using the changed correlation coefficient data, the path data 1112, the delay variation data of each cell 1113, and the maximum stage number data 1212, and weighted delay variation data of each cell 1213 is generated (step 1204). Using the data 1213, the standard deviation of the target circuit is calculated (step 1206).

In step 1204, the standard deviation of the cell is weighted according to any of the above methods (d), (e) or (g). When applying (d), n is used as the total number of the cells in the target circuit. When adding a constant weight to the standard deviation for paths that the types of cells are almost the same and the correlations of the cells are equal, (e) is employed with the maximum stage number data 1212 as the maximum value m of the number of elements.

FIG. 14 shows an example of a circuit to which the method (e) is applied. This circuit comprises two flip-flops 1401 and 1402 and four inverters 1403 through 1406, and clock skew is generated by a path comprising the inverters 1403 through 1406 connected in series. At that point, the standard deviation of the path is calculated by the equation (27) with m=4.

When the method (g) is employed, the weighted standard deviations of respective cells are calculated by the equation (23), using a provided correlation coefficient $r_{ij}$.

Note that the processes in steps 1201, 1202, 1203 and 1205 are not always necessary, but one or more of these processes may be combined or all processes may be omitted.

In steps 1204 and 1206, it is possible to calculate the standard deviation of the target circuit in accordance with the above method (a). In such a case, the processes in steps 1201, 1202, 1203 and 1205 are omitted, and all correlation coefficients are introduced as a constant value X. By multiplying the standard deviation obtained by the equation (2) by X, the conventional standard deviation can be corrected.

Next, a concrete example of the timing verification in a circuit of FIG. 15 is explained. This circuit comprises two flip-flops 1501 and 1502, a data path 1503, and two clock paths 1504 and 1505, and each of the data path 1503 and the clock paths 1504 and 1505 comprise a plurality of cells.

In this example, the amounts of delay of the flip-flop 1501 (CK-Q delay), in the data path 1503, in the clock path 1504 and in the clock path 1505 are assigned as DF, DD, DC1, and DC2, respectively, and setup time and hold time of the flip-flop 1502 are assigned as S and H, respectively. Also, the clock cycle is assigned as T, and the standard deviation as the whole circuit calculated in step 1206 of FIG. 12 is assigned as σ.

At that time, in step 1105 of FIG. 11, for timing verification of the setup time and the hold time, an evaluation values ES and EH, respectively, are calculated as below.

$$ES=DC1+DF+DD-DC2-T+S+\sigma \quad (29)$$

$$EH=DC2-DC1-DF-DD+H+\sigma \quad (30)$$

Each of the evaluation values is compared with a threshold 0, and when ES<0 and EH<0, the verification result is OK. When 3σ model or 5σ model is employed, 3σ or 5σ is used in the equation (29) and the equation (30) instead of σ.

Assuming that the standard deviation calculated by applying the conventional equation (2) to the whole circuit of FIG. 15 is Z, the standard deviation a calculated in accordance with the above methods (a), (d) or (e) can be the followings.

$$(a) \; \sigma = XZ \quad (31)$$

$$(d) \; \sigma = Z\sqrt{1+(n-1)r_{max}} \quad (32)$$

$$(c) \; \sigma = Z\sqrt{1+(m-1)r_{max}} \quad (33)$$

In the above description of the embodiment, the case of the timing verification of a circuit comprising a plurality of cells using the delay and the standard deviation of the cell comprising a plurality of elements is explained in main. However, it is possible to apply the present invention in a case of timing verification of a circuit comprising a plurality of elements using the delay and the standard deviation of each element. In such a case, the above timing verification may be performed regarding each element as one cell.

The timing analyzer apparatus of the present embodiment is comprised of an information processing apparatus (a computer) shown in FIG. 16, for example. The information processing apparatus of FIG. 16 comprises a CPU 1601, memory 1602, an input device 1603, an output device 1604, an external storage device 1605, a medium driving device 1606, and a network connection device 1607, and these are connected to each other by a bus 1608.

The memory 1602 includes a ROM (Read Only Memory), a RAM (Random Access Memory) and others, for example, and stores programs and data used for the processes. The CPU 1601 performs timing analysis process by executing the programs utilizing the memory 1602.

The net list 1111, the path data 1112, the delay variation data of each cell 1113, and the delay data of each cell 1114 in FIG. 11 and the type correlation coefficient data 1211, the maximum stage number data 1212, and the weighted delay variation data of each cell 1213 in FIG. 12 are temporarily stored in the memory 1602 as data of a process target or a process result.

The input device 1603 may be a keyboard, a pointing device or others, for example, and is used for input of an instruction and information from a user. The output device 1604 may be a display, a printer, a speaker and others, for example, and is used for output of inquiry to a user and a process result.

The external storage device 1605 may be a magnetic disk device, optical disk device, a magnetooptical disk device, a tape device and others, for example. The information processing apparatus stores programs and data in this external storage device 1605, loads the programs and data to the memory 1602 as necessary for use.

The medium driving device 1606 drives a portable recording medium 1609, and accesses to the recording contents. The portable recording medium 1609 is any computer-readable recording medium such as a memory card, a flexible disk, an optical disk, and a magnetooptical disk. A user stores programs and data in the portable recording medium 1609, and loads the programs and data to the memory 1602 as necessary for use.

The network connection device 1607 is connected to any communication network such as LAN (Local Area Network), and performs data conversion involving communications. The information processing apparatus, as necessary, receives programs and data from the external device via the network connection device 1607, and loads the programs and data to the memory 1602 for use.

FIG. 17 shows a method for providing programs and data to the information processing apparatus of FIG. 16. The programs and data stored in the portable recording medium 1609 or a database 1711 of a server 1701 are loaded to the memory 1602 of an information processing apparatus 1702. The server 1701 generates a propagation signal for propagating the programs and data, and transmits it to the information processing apparatus 1702 via any transmission media on the network. The CPU 1601 executes the program using the data, and performs a necessary process.

What is claimed is:

1. A timing analyzer apparatus comprising:
   a storage device for storing path data indicating a plurality of cells constituting a timing verification target circuit in a semiconductor integrated circuit, delay data and standard deviation data of each cell, a weight for calculating a standard deviation of delay of the target circuit, and a threshold of timing verification;
   a standard deviation calculation device for calculating a sum of squares of standard deviations of the plurality of the cells using the path data and the standard deviation data of each cell, calculating a square root of the sum of squares, and obtaining the standard deviation of delay of the target circuit by multiplying the calculated square root by the weight;
   a delay calculation device for calculating delay of the target circuit by using the path data and the delay data of each cell;
   an evaluation value calculation device for calculating an evaluation value for timing verification by using the standard deviation of delay of the target circuit and the delay of the target circuit;
   a verification device for performing the timing verification by comparing the evaluation value with the threshold; and
   an output device for outputting a verification result.

2. The timing analyzer apparatus according to claim 1, wherein
   the storage device further stores a maximum value $r_{max}$ of correlation coefficients of the plurality of the cells and a maximum number n of adjacent cells correlations of which are to be considered, and
   the standard deviation calculation device, using the maximum value $r_{max}$ and the maximum number n, calculates a value $$\sqrt{1+(n-1)r_{max}},$$

and stores the value in the storage device as the weight.

3. The timing analyzer apparatus according to claim 1, wherein
   the storage device further stores a maximum value $r_{max}$ of correlation coefficients of the plurality of the cells, and
   the standard deviation calculation device classifies adjacent cells correlations of which are to be considered into a plurality of sets each of which comprises cells with close standard deviations, calculates a maximum value m of element numbers of respective sets, calculates a value $$\sqrt{1+(m-1)r_{max}}$$

using the maximum value $r_{max}$ and the maximum value m, and stores the value in the storage device as the weight.

4. The timing analyzer apparatus according to claim 1, wherein the weight introduces an effect of a correlation coefficient between cells into the calculating the standard deviation of delay of the target circuit.

5. The timing analyzer apparatus according to claim 1, wherein the time verification verifying whether the target circuit operates within a delay time range.

6. A physical storage medium for recording a program causing a computer to perform:
   extracting from a storage device, path data indicating a plurality of cells constituting a timing verification target circuit in a semiconductor integrated circuit and standard deviation data of each cell;
   calculating a sum of squares of standard deviations of the plurality of the cells using the path data and the standard deviation of each cell;
   calculating a square root of the sum of squares;
   extracting a weight from the storage device;
   multiplying the square root by the weight and calculating a standard deviation of delay of the target circuit;
   extracting the delay data of each cell from the storage device;
   calculating delay of the target circuit by using the path data and the delay data of each cell;
   calculating an evaluation value for timing verification by using the standard deviation of delay of the target circuit and the delay of the target circuit;
   extracting a threshold of the timing verification from the storage device;
   performing the timing verification by comparing the evaluation value and the threshold; and
   outputting a verification result.

7. The storage medium according to claim 6, wherein the program causes the computer to further perform:
   extracting from the storage device, a maximum value $r_{max}$ of correlations coefficient of the plurality of cells and a maximum number n of adjacent cells correlations of which are to be considered;
   calculating a value $\sqrt{1+(n-1)r_{max}}$; and
   storing the value in the storage device as the weight.

8. The storage medium according to claim 6, wherein the program causes the computer to further perform:
   classifying adjacent cells correlations of which are to be considered into a plurality of sets each of which comprises cells with close standard deviations;
   calculating a maximum number m of element numbers of respective sets;
   extracting a maximum value $r_{max}$ of correlation coefficients of the plurality of the cells from the storage device;
   calculating a value $\sqrt{1+(m-1)r_{max}}$; and
   storing the value in the storage device as the weight.

9. The storage medium according to claim 6, wherein the weight introduces an effect of a correlation coefficient between cells into a calculation of a standard deviation of delay of the target circuit.

10. The storage medium according to claim 6, wherein the timing verification verifying whether the target circuit operates within a delay time range.

11. A physical storage medium for recording a program causing a computer to perform:
    extracting from a storage device, path data indicating n cells constituting a timing verification target circuit in a semiconductor integrated circuit, a standard deviation $\sigma_i$ (i=1, 2, ..., n) of each cell and a correlation coefficient $r_{ij}$ (j=1, 2, ..., n, $r_{ii}$=1, $r_{ij}$=$r_{ji}$) between an i-th cell and a j-th cell;
    calculating a weighted standard deviation $\Gamma_i$ of n cells by multiplying the standard deviation $\sigma_i$ of the n cells indicated by the path data by a weight value $$\sqrt{\sum_{j=1}^{n} r_{ij}};$$

calculating the sum of squares of the weighted standard deviation $\Gamma_i$ of the n cells;
    calculating a square root of the sum of squares as a standard deviation $\sigma$ of delay of the target circuit;
    extracting delay data of each cell from the storage device;
    calculating delay of the target circuit by using the path data and the delay data of each cell;
    calculating an evaluation value for timing verification by using the standard deviation $\sigma$ of delay of the target circuit and the delay of the target circuit;
    extracting a threshold of the timing verification from the storage device;
    performing the timing verification by comparing the timing evaluation value with the threshold; and
    outputting a verification result.

12. The storage medium according to claim 11, wherein the program causes the computer to replace the correlation coefficient $r_{ij}$ in the calculating the weighted standard deviation $\Gamma_i$ by $-r_{ij}$, and calculate the standard deviation $\sigma$ of delay of the target circuit, when the path data indicates that the i-th cell and the j-th cell has a parallel relation.

13. The storage medium according to claim 11, wherein the program causes the computer to replace the correlation coefficient $r_{ij}$ in the calculating the weighted standard deviation $\Gamma_i$ by 0, and calculate the standard deviation $\sigma$ of delay of the target circuit, when the standard deviations $\sigma_i$ and $\sigma_j$ are in a relation $$r_{ij} \gg \frac{\sigma_i}{\sigma_j}, (\sigma_i \ll \sigma_j).$$

* * * * *